(12) United States Patent
Tanaka

(10) Patent No.: US 6,933,179 B1
(45) Date of Patent: Aug. 23, 2005

US006933179B1

(54) METHOD OF PACKAGING SEMICONDUCTOR DEVICE

(75) Inventor: Yasuo Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 141 days.

(21) Appl. No.: 09/660,484

(22) Filed: Sep. 12, 2000

(30) Foreign Application Priority Data

Jan. 19, 2000 (JP) ........................................ 2000-010676

(51) Int. Cl.⁷ ............................................. H01L 21/56
(52) U.S. Cl. ........................ 438/127; 438/614; 438/692; 438/781
(58) Field of Search ................................. 438/127, 614, 438/692, 781, 124, 612, 613, FOR 111, FOR 384; 257/778, 737

(56) References Cited

U.S. PATENT DOCUMENTS

| | | | | |
|---|---|---|---|---|
| 5,379,187 A | * | 1/1995 | Lee et al. ................... | 361/707 |
| 5,726,222 A | * | 3/1998 | Sawaoka et al. ............ | 523/211 |
| 6,063,646 A | * | 5/2000 | Okuno et al. | |
| 6,083,819 A | * | 7/2000 | Willie et al. ................ | 438/612 |
| 6,113,728 A | * | 9/2000 | Tsukagoshi et al. ........ | 156/264 |
| 6,150,435 A | * | 11/2000 | Bayer et al. ................ | 523/434 |
| 6,181,569 B1 | * | 1/2001 | Chakravorty | |
| 6,194,788 B1 | * | 2/2001 | Gilleo et al. | |
| 6,210,811 B1 | * | 4/2001 | Honda et al. ............... | 428/620 |
| 6,232,213 B1 | * | 5/2001 | King et al. ................. | 438/613 |
| 6,235,842 B1 | * | 5/2001 | Kuwano et al. | |
| 6,239,013 B1 | * | 5/2001 | Hotchkiss ................... | 438/616 |
| 6,278,192 B1 | * | 8/2001 | Takigawa et al. | |
| 6,287,893 B1 | * | 9/2001 | Elenius et al. ............. | 438/108 |
| 6,338,767 B1 | * | 1/2002 | Nakatani et al. ........... | 156/233 |
| 6,383,659 B1 | * | 5/2002 | Honda et al. ............... | 428/620 |
| 6,392,217 B1 | * | 5/2002 | Teranuma et al. ....... | 250/208.1 |
| 6,447,915 B1 | * | 9/2002 | Komiyatani et al. ........ | 428/416 |
| 2001/0003058 A1 | * | 6/2001 | Gilleo et al. | |
| 2001/0005548 A1 | * | 6/2001 | Farquhar et al. ........... | 428/325 |
| 2002/0030558 A1 | | 3/2002 | Fukasawa et al. | |

FOREIGN PATENT DOCUMENTS

| | | |
|---|---|---|
| JP | 63-145323 | 6/1988 |
| JP | 9-82850 | 3/1997 |
| JP | 10-79362 | 3/1998 |
| JP | 11-343332 | 12/1999 |
| JP | 2000-299333 | 10/2000 |
| JP | 2001-102499 | 4/2001 |
| JP | 2001-144123 | 5/2001 |

OTHER PUBLICATIONS

Nikkei Microdevices, Aug. 1998; pp. 44–59.
Nikkei Microdevices, Apr. 1998; pp. 164–167.

* cited by examiner

*Primary Examiner*—George Fourson
(74) *Attorney, Agent, or Firm*—Rabun & Berdo, PC

(57) ABSTRACT

When a wafer, which has completed a wafer process and has a main surface on which a plurality of bumps respectively connected to a plurality of electrode pads are formed, is brought into a resin molded type package to thereby manufacture a semiconductor device, a method of manufacturing such a semiconductor device includes placing a sheet encapsulating material containing a thermosetting resin over the wafer so as to cover the main surface of the wafer and, heating and curing the sheet encapsulating material by a heating apparatus to thereby form an encapsulating resin layer.

23 Claims, 5 Drawing Sheets

ELAPSED TIME

METHOD OF PACKAGING SEMICONDUCTOR DEVICE

BACKGROUND OF THE INVENTION

1. Field of the Invention

The present invention relates principally to a method of manufacturing a semiconductor device in a resin molded type package process, and particularly to a chip size package technique at a wafer level.

2. Description of the Related Art

A wafer level CSP (Chip Size Package) technique has been developed in recent years, so that a wafer process (pre-process) and a package process (post-process) taken for granted that they are completely separated from each other, have been combined into one. Thus, the entire framework of LSI industries has completely changed.

The wafer level CSP has been disclosed in the April 1998 issue of the "Nikkei Microdevice", p164–167 and the August 1998 issue of the "Nikkei Microdevice", p44–59. This technique will be explained with reference to FIG. 8. FIG. 8 is a cross-sectional view showing a process for manufacturing a semiconductor device according to the wafer level CSP.

First of all, electrode pads are relocated in a wafer having finished a wafer process and thereafter bumps are formed. An encapsulation mold (hereinafter called "mold") is divided into an upper mold 56 and a lower mold 58. The lower mold 58 comprises an internal mold 60 and an external mold 62. These molds are heated at 175° C. The upper mold 56 is caused to absorb a mold-release film 64. A bumps-bearing wafer 66 in which the electrode pads have been relocated, is placed over the internal mold 60 of the lower mold 58, and an encapsulating resin 68 is placed thereon (see FIG. 8(A)).

The encapsulating resin 68 is melted by heat and pressure of the mold and spread over the entire surface of the bumps-bearing wafer 66 with the electrode pads relocated therein. Further, the encapsulating resin 68 is held within the mold and cured (see FIG. 8(B)). Thereafter, the bumps-bearing wafer 66 is taken out of the mold (see FIG. 8(C)). The bumps-bearing wafer 66 formed integrally with the mold-release film 64 in this way can be obtained. When the mold-release film 64 is peeled from the bumps-bearing wafer 66, bump top portions or tops 70 are exposed (FIG. 8(D)). Thereafter, external terminals 72 are formed over their corresponding bump tops 70 (see FIG. 8(E)). The wafer is cut into each piece, so that a semiconductor device 74 is completed (see FIG. 8(F)).

Owing to the use of such a method, the wafer can be cut into each chip size after the wafer is encapsulated in one lot in the package process. Thus, the package can be reduced in size up to just the same size as each chip.

An advantageous effect is also brought about in that since the number of chips obtainable from one wafer increases when the area of each chip is reduced with advances in scale-down technology, the cost per package is reduced.

However, the above-described wafer level CSP has problems such as will be described below.

Namely, since an expensive mold was used (problem 1), it was necessary to fabricate an expensive mold again when a wafer increased in diameter. With an increase in the diameter of the wafer, a resin needed to make an improvement to high flowability so as to extend to the end of the wafer (there is a possibility that other physical properties will be degraded due to the setting of the resin to the high flowability) (problem 2). Further, the resin might remain on the bump tops according to the positions of the bumps (problem 3). The mold-release film expensive and large in environment load had to be used (problem 4). Further, since compression molding is done (problem 5), the thickness of the resin is easy to vary, and strict weight control on the encapsulating resin is required. Further, the bumps might sustain damage during molding.

With the foregoing problems in view, it is therefore an object of the present invention to provide a method of manufacturing a semiconductor device, which is capable of solving the above problems, reducing the cost of manufacturing even if a wafer increases in diameter and holding performance and reliability.

In order to achieve the above-described object, there is provided a method of manufacturing a semiconductor device, according to the present invention, which, when a wafer having a main surface on which a plurality of bumps respectively connected to a plurality of electrode pads are formed, is brought into a resin molded type package to thereby manufacture the semiconductor device, comprises:

(a) placing a sheet encapsulating material containing a thermosetting resin over the wafer so as to cover the main surface; and (b) heating and curing the sheet encapsulating material by a heating apparatus to thereby form an encapsulating resin layer.

Here, the placement of the sheet encapsulating material over the wafer so as to cover the main surface means that the sheet encapsulating material is placed so as to completely cover the main surface with the bumps formed thereon (this includes even a substantially complete case).

Incidentally, the heating and curing described herein includes even curing based on natural heating like the occurrence of a curing reaction due to a variation in temperature when, for example, a sheet encapsulating material held in a low-temperature state is returned to room temperature. The sunlight or the like is included as the heating apparatus.

Upon carrying out the present invention, a step for polishing the encapsulating resin layer to thereby expose the tops of the bumps may preferably be included after the step for forming the encapsulating resin layer.

Typical ones of various inventions of the present application have been shown in brief. However, the Various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFFERED EMBODIMENTS

Figure 1A:
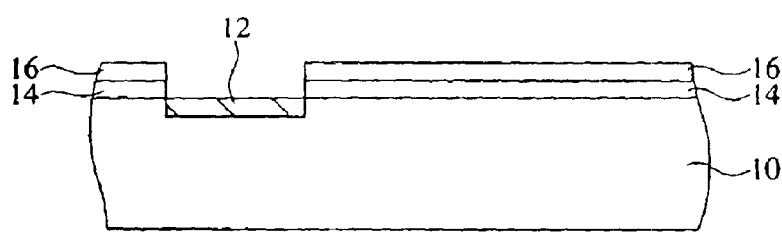
FIGS. 1(A) through 1(D) are respectively cross-sectional views showing a process for forming bumps through relocation.
Figure 1B:
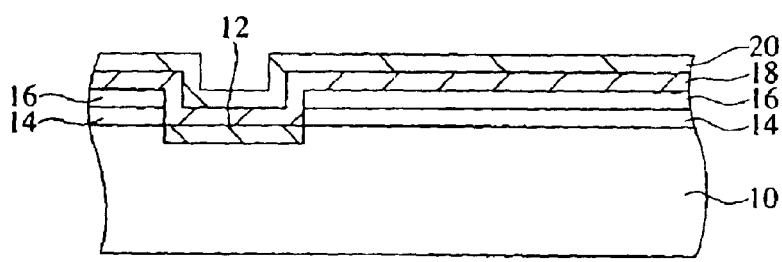
Figure 1C:
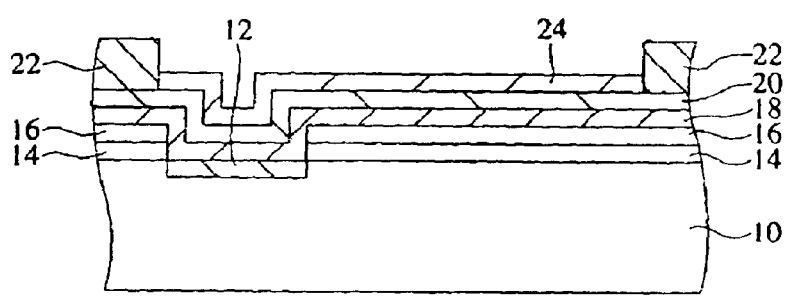
Figure 1D:
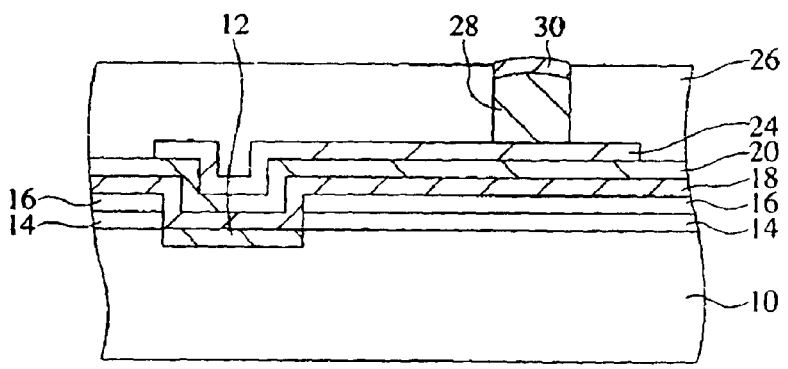

Preferred embodiments of the present invention will hereinafter be described with reference to the accompanying drawings. Incidentally, the sizes, forms and placement of respective components in the drawings are merely diagrammatically shown to such an extent that it is possible to understand the present invention. Further, numeric conditions to be described later are merely illustrative examples.

A first embodiment will first be described with reference to FIGS. 1 and 2. FIG. 1 is a cross-sectional view showing a process for forming bumps through relocation, and FIG. 2 is a cross-sectional view illustrating a method of manufacturing a semiconductor device, respectively.

The process for manufacturing the semiconductor device roughly comprises two processes in parts. Namely, they are a process (wafer process) for forming an integrated circuit such as an LSI or the like over a wafer, and a process (package process) for packaging the wafer with the integrated circuit formed therein. In the conventional package process, chips are cut from the wafer and thereafter the respective chips have been packaged. According to a wafer level CSP, however, a wafer is cut into chips after the wafer has been packaged. Further, the wafer level CSP is provided with a process (hereinafter called "relocating process) for forming bumps over electrode pads and replacing or relocating the electrode pads respectively. Thus, the wafer process and the package process cannot be strictly separated from each other in the wafer level CSP. However, a process up to the completion of the step for forming the integrated circuit such as LSI or the like over the wafer is regarded as the wafer process, and the relocating process and its subsequent package process (including even the chip cutting) are considered to be the package process in a broad sense. The present embodiment is intended for the package process in the broad sense. The relocating process and the package process (including the cutting of the chips) will be described apart from each other.

(1) In the relocating process, a plurality of bumps are formed over a wafer in which the wafer process has been completed, in a state in which a plurality of electrode pads are respectively electrically connected thereto.

One example of the process for replacing or relocating the electrode pads to thereby form the bumps will be explained with reference to FIG. 1.

An insulating film, e.g., an SiN layer 14 and a polyimide layer 16 are formed over a wafer 10. At this time, etching or the like is performed in such a manner that the SiN layer 14 and the polyimide layer 16 will not be formed over each of electrode pads 12 comprised of Al, for example (see FIG. 1(A)). The SiN layer 14 is provided as a surface protective film, whereas the polyimide layer 16 is provided so as to mainly reduce or relax a stress developed due to heat generated when a chip is in use. Next, a metal thin film is deposited over the surface of the wafer by a sputtering method (see FIG. 1(B)). This film has a two-layer structure comprised of a contact or adhesion metal layer 18 and a Cu layer 20. These metal thin films 18 and 20 are used as power-feeding layers used for an electrolytic plating process necessary for the subsequent wiring forming and bump forming process steps. Next, pattern processing is effected on the surface of the Cu layer 20 by a resist 22, and thereafter a re-wiring pattern 24 composed of Cu is formed by electrolytic plating (see FIG. 1(C)). Next, bumps 28 and barrier metal layers 30 are formed by electrolytic plating using Cu after the execution of the pattern processing, by the resist 26 (see FIG. 1(D)). The height of each bump 28 is set to reach about 100 $\mu$m herein. While Cu is used for the Cu layer 20, re-wiring pattern 24, bumps 28 and barrier metal layers 30 in the present embodiment, for example, Au may be used without sticking to it. However, the same metal may preferably be used for these layers. Thereafter, the resist 26 is removed although not shown in the drawing.

Owing to such relocation, the bumps 28 electrically connected to their corresponding electrode pads 12 function as electrodes. Thus, owing to such relocation, the electrode pads 12 located on the periphery of the wafer 10 are generally arranged in position, and the distance between the adjacent bumps 28 extends, so that they are easy to be connected to external interconnections upon connection to them.

As the bumps 28 increase in height, the bumps 28 absorb a stress developed due to the difference in thermal expansion in a junction or bonding interface between a printed board and a bumps-bearing wafer in which the electrodes pads have been relocated.

(2) In the package process, the wafer 10 having a main surface with the plurality of bumps 28 formed thereon, which has completed the relocating process and are respectively connected to the plurality of electrode pads 12, is brought into a resin encapsulation or molded type package, whereby a semiconductor device is fabricated.

A process for manufacturing the semiconductor device, according to the present invention will be explained with reference to FIG. 2. FIG. 2 shows a state in which the wafer (corresponding to one obtained by removing the resist 26 from FIG. 1(D)) in which the bumps 28 are formed through the relocation in FIG. 11 is shown in simplified form, and a plurality of bumps 28 are provided over the wafer. A wafer in which electrode pads (315. shown in FIG. 2 are relocated to form bumps, will be referred to as "bumps-bearing wafer". The bumps-bearing wafer 35 corresponds to one obtained by removing the resist 26 from FIG. 1(D). Thus., a wafer (hereinafter called "wafer") 32 with electrode pads relocated thereon corresponds to one including the wafer 10, SiN layer 14, polyimide layer 16, adhesion metal layer 18, Cu layer 20 and re-wiring pattern 24 shown in FIG. 1(D). Bumps 34 shown in FIG. 2 respectively correspond to those including the bumps 28 and barrier metal layers 30 shown in FIG. 1.

This package process includes a first step for placing a sheet sealing or encapsulating material 36 containing a thermosetting resin over the bumps-bearing wafer 35 so that it covers the main surface of the bumps-bearing wafer 35, a second step for heating and curing the sheet encapsulating material 36 through the use of a heating apparatus, thereby forming an encapsulating resin layer 37, a third step for polishing the encapsulating resin layer 37 to thereby expose the tops of the bumps 34, a fourth step for forming external terminals 38 each having conductivity so as to be connected to their corresponding bumps 34, and a fifth step for cutting the wafer in which the formation of the external terminals 38 has been terminated, into chips, i.e., dividing it into each individual semiconductor devices 40.

The heating and curing include two kinds of methods: a method of heating the bumps-bearing wafer 35 by the heating apparatus after the provision of the sheet encapsulating material 36, and a method of heating the bumps-bearing wafer 35 by the heating apparatus before the provision of the sheet encapsulating material 36. Thus, in the former method the bumps-bearing wafer 35 is not heated in the first step referred to above, and the bumps-bearing wafer 35 and sheet encapsulating material 36 are simultaneously heated in the second step. On the other hand, in the latter method, the bumps-bearing wafer 35 has already been heated in the first step, whereas in the second step, only the sheet encapsulating material 36 is heated. While the heating and curing have been performed by the latter method in the present embodiment, they are not necessarily limited to it. They may be performed by either of them.

The respective steps will next be explained in detail with reference to the drawings.

Figure 2A:
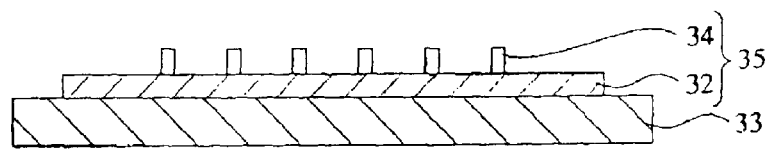
FIGS. 2(A).through 2(E) are respectively cross-sectional views illustrating a process for manufacturing a semiconductor device.

In the first step, the bumps-bearing wafer 35 is first heated to a curing temperature or higher (see FIG. 2(A)). The heating apparatus 33 may be one whose area is larger than the main surface of the bumps-bearing wafer 35 with the electrode pads relocated thereon and which is capable of uniformly heating the bumps-bearing wafer 35, to an intended temperature. Further, the heating apparatus 33 takes such a structure as to heat the bumps-bearing wafer 35 and the sheet encapsulating material 36 in a non-compressed state. In the present embodiment, the size of the bumps-bearing wafer 35 is set to a substantially circle having a diameter of 150 mm, and the height of each bump 34 is set to about 100 μm as described above.

Next, when the bumps-bearing wafer 35 is brought to a constant temperature, i.e., the curing temperature or higher, the sheet encapsulating material 36 is provided or placed over the bumps-bearing wafer 35 so as to cover the main surface of the bumps-bearing wafer 35.

In the second step, the so-placed sheet encapsulating material 36 undergoes a softened state by being heated with the heating apparatus 33. Thereafter, when the sheet encapsulating material 36 reaches the curing temperature, a curing reaction occurs so that the sheet encapsulating material 36 is heated and cured. As a result, the encapsulating resin layer 37 is formed (see FIG. 2(B)).

In the present embodiment, the sheet encapsulating material 36 contains a thermosetting resin, a curing agent, a filler, an antifoaming agent, etc. An epoxy resin is used as the thermosetting resin. Further, the curing agent is enclosed in a thin film-shaped capsule and contained in the sheet encapsulating material 36. Since the capsule is to be broken at a predetermined temperature, the thermosetting resin reacts with the curing agent when it is heated to the predetermined temperature, so that the thermosetting resin begins to cure (the predetermined temperature will hereinafter be called "curing temperature"). Thus, the setting of the curing temperature can be varied according to arbitrary selection of a thin film which constitutes the capsule. In the present embodiment, the curing temperature was set to 120° C. Since the conventional encapsulating resin develops a curing reaction little by little even in the case of a low temperature, it needed to be held at less than or equal to 5° C., for example. Since, however, no curing reaction occurs in the sheet encapsulating material 36 at the curing temperature or less, it is not necessary to hold it at the low temperature.

Figure 2B:
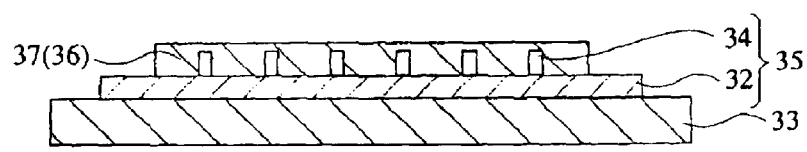

In order to place the sheet encapsulating material 36 so as to cover a main surface of the wafer 32, the sheet encapsulating material 36 is cut so as to take a substantially circle having a diameter of 146 mm according to the shape of the wafer 32. When the sheet encapsulating material 36 now extends off the wafer 32 when it covers the main surface thereof, the thermosetting resin will flow down to the sides of the wafer 32 upon heating. Further, when the size of the sheet encapsulating material 36 is excessively smaller than that of the wafer 32, incomplete resin encapsulation is done. It is thus desirable that the sheet encapsulating material 36 is slightly smaller than such a size that no resin flows down to the sides of the wafer 32 and it performs a sufficient function when the encapsulating resin layer 37 is formed, i.e., the size of the wafer 32. It may preferably be better if the sheet encapsulating material 36 is not so thickened in consideration of voids easiness to escape, which will be described later. Accordingly, the thickness of the sheet encapsulating material 36 was set to 150 μm in the present embodiment. When the temperature for heating the sheet encapsulating material 36 in the above-described second step is set to, for example, 150° C. greater than or equal to 120° C. corresponding to the curing temperature, the sheet encapsulating material 36 is first softened to thereby adhere to the wafer 32 and each bump 34 along the shapes thereof. Thereafter, the thermosetting resin is cured according to the curing reaction. At this time, the sheet encapsulating material 36 is cured in a state of having covered the bumps 34 therewith as shown in FIG. 2(B).

Figure 2C:
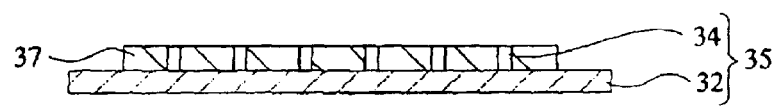

As the third step, the bumps-bearing wafer 35 with the encapsulating resin layer 37 formed thereon is thereafter separated from the heating apparatus 33, and the encapsulating resin layer 37 is polished to thereby expose the tops of the bumps 34 (see FIG. 2(C)). At this time, the polishing may be done uniformly so that the thickness of- the encapsulating resin layer 37 and the distance from the main surface of the wafer 32 become constant.

Figure 2D:
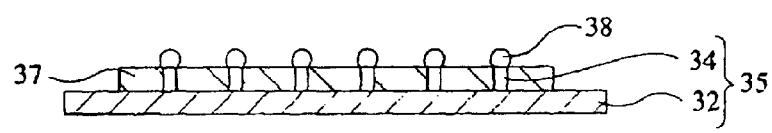

Next, the external terminals 38 each having conductivity are formed at their corresponding tops of the bumps 34 whose tops are exposed, by, for example, solder as the fourth step (see FIG. 2(D)). As to the external terminals 38, they are fabricated in another process step and thereafter may be formed on their corresponding tops of the bumps 34 with being placed thereon. Alternatively, holes are defined only in the tops of the bumps 34 after the formation of a resist film, and a mask is formed. Thereafter, a material for the external terminals 38 may be poured therein and solidified to form the external terminals 38.

Figure 2E:

Next, as the fifth step, the bumps-bearing wafer 35 with the external terminals 38 formed thereon is cut into each individual chips (see FIG. 2(E)). For example, normal dicing may be done to cut the bumps-bearing wafer 34 into the chips. According to this step, each semiconductor device 40 is completed.

According to the process steps employed in the present embodiment, since mold and mold-release films are not used, a semiconductor device can be manufactured at low cost as compared with the conventional wafer level CSP.

Even if the diameter of the wafer 32 increases, the semiconductor device is slight or low in modification cost and a significant change in the design of the sheet encapsulating material 36 is unnecessary, and the area may simply be increased. Since the area of the encapsulating resin with respect to the main surface of the wafer is small in the prior art, high flowability has been required as the diameter of the wafer increases. However, since there is provided the sheet encapsulating material 36 for covering the main surface of the wafer in the present invention, no high flowability is required. It is thus unnecessary to change the physical property of the sheet encapsulating material 36. Further, since no high flowability is required, no limitation is imposed on an upper limit of the constituent rate of a filler leading to a reduction in flowability. Thus, the degree of freedom of the design of the sheet encapsulating material 36 increases. Since, at this time, the filler has the function of reducing a stress of the encapsulating resin, the constituent rate of the filler is increased so that the stress of the encapsulating resin can be reduced. Further, since no compression molding is done, variations in resin thickness do not occur as in the conventional example, and the bumps 34 do not sustain damage. Furthermore, the load on the bumps-bearing wafer 35 is small in the step for exposing the tops of the bumps 34.

Figure 3:
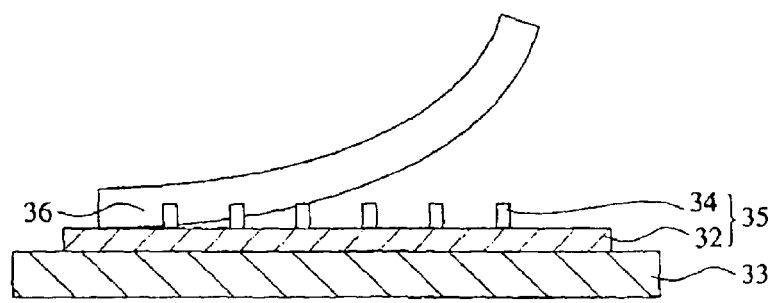
FIG. 3 is a cross-sectional view depicting a modification of a method of manufacturing the semiconductor device, according to a first embodiment.

A modification of the present embodiment will next be described with reference to FIG. 3. FIG. 3 is a cross-sectional view showing a modification of the manufacturing method according to the first embodiment.

In the present modification, a sheet encapsulating material 36 is provided over a bumps-bearing wafer 35 so as to cover a main surface of the bumps-bearing wafer 35 in a second step. At this time, however, the sheet encapsulating material 36 is placed over the bumps-bearing wafer 35 so as to force out the air and so that the sheet encapsulating material 36 successively adheres onto the bumps-bearing wafer 35 from the end thereof. Since the present modification is precisely identical to the first embodiment except for the method of placing the sheet encapsulating material 36, the description thereof will therefore be omitted.

Voids are developed or produced in the sheet encapsulating material 36 based on, for example, air originally contained in the sheet encapsulating material 36 and air collected when the sheet encapsulating material 36 is placed over the bumps-bearing wafer 35. Thus, according to such a method, since the amount of air collected between the sheet encapsulating material 36 and the bumps-bearing wafer 35 is reduced, the voids are hard to be developed in the sheet encapsulating material 36 cured in the second step.

Further, the device configuration, material, numerical values, etc. employed in the present embodiment are not limited to above. They may be replaced by other preferred ones respectively.

For example, the sheet encapsulating material 36 may use one comprised of other materials if the thermosetting resin is contained therein.

A second embodiment will next be described with reference to FIG. 2.

The present embodiment is different from the first embodiment in a method of heating and curing a sheet encapsulating material 36 in first and second steps of a package process. The temperature of the sheet encapsulating material 36 is less than or equal to a curing temperature at which the sheet encapsulating material 36 is cured. The sheet encapsulating material 36 is held low in viscosity and kept for a predetermined time at a temperature at which voids contained in the sheet encapsulating material 36 are easy to be eliminated. Afterwards, the sheet encapsulating material 36 is increased to the curing temperature or higher.

Since other steps, i.e., a relocating step, and third, fourth and fifth steps in the package process are just the same as those employed in the first embodiment, the description thereof will therefore be omitted.

In a first step, the bumps-bearing wafer 35 has first been heated to the curing temperature or higher in the first embodiment (see FIG. 2(A)), whereas in the present embodiment, the temperature of the sheet encapsulating material 36 is less than or equal to a curing temperature at which the sheet encapsulating material 36 is cured. The sheet encapsulating material 36 is kept low in viscosity-and heated to a temperature at: which voids contained in the sheet encapsulating material 36 are easy to be eliminated. Described specifically, a temperature at which the viscosity of the sheet encapsulating material 36 is minimum or reaches a state close to it, i.e., a temperature at which the thermal expansion coefficient of air is large, is selected. Since the viscosity of the sheet encapsulating material 36 increases when the temperature thereof reaches a curing temperature at which a curing agent and-a thermosetting resin react with each other, the temperature thereof must be set lower than the curing temperature. Since an epoxy resin is used as the sheet encapsulating material 36 in the present embodiment, it softens at about 40° C. or higher. Further, a capsule with a curing agent enclosed in the sheet encapsulating material 36 is designed so as to break if about 120° C. is reached. The temperature at which the voids are easy to be eliminated, is considered to be preferably a little less than 120° C. when these conditions are taken into consideration with the thermal expansion coefficient of air large at the high temperature rather than at a low temperature. The temperature may be set to a temperature of 110° C. to 115° C., for example.

In a second step, the sheet encapsulating material 36 is placed over a bumps-bearing wafer 35 so as to cover a main surface of a wafer 32 when the bumps-bearing wafer 35 reaches a predetermined temperature. Thereafter, the sheet encapsulating material 36 is held for a predetermined time while it is being kept at the temperature at which the voids in the first step are easy to be eliminated, followed by rise to the curing temperature or higher.

In the present embodiment, the sheet encapsulating material 36 was held for a predetermined time, about 10 minutes at the easy-to-eliminate voids temperature, i.e., a temperature of from 110° C. to 115° C. As a result, the voids escape onto the surface of the sheet encapsulating surface 36, and are hence expelled outside from the sheet encapsulating material 36 by an antifoaming agent contained in the sheet encapsulating material 36. Thus, the voids are further easy to escape from the sheet encapsulating material 36 as compared with the first embodiment. Owing to heating of the sheet encapsulating material 36 to the curing temperature, e.g., 150° C. after the escaping of the voids therefrom, the sheet encapsulating material 36 is cured to form an encapsulating resin layer 37.

Incidentally, the predetermined temperature at which the capsule breaks, can be designed according to the selection of a material for the capsule, the void escape temperature can be designed based on the composition of the resin. Accordingly, the step for allowing the voids to escape and the step for causing the curing reaction can-be stably processed in consideration of variations at manufacture.

Incidentally, the voids, which are taken as the objects in the present embodiment, principally result from air originally contained in the sheet encapsulating material 36. Further, the method of placing the sheet encapsulating material 36, which has been described in the modification of the first embodiment, may be utilized in combination with the present embodiment to efficiently eliminate the voids resultant from air mixed between the sheet encapsulating material 36 and the wafer.

As described above, the heating and curing include two types of methods: a method of heating the bumps-bearing wafer 35 by a heating apparatus after the provision of the sheet encapsulating material 36, and a method of heating the bumps-bearing wafer 35 by the heating apparatus before the provision of the sheet encapsulating material 36. In the present embodiment, the heating and curing are done according to the latter method but not limited to it. It may be performed by either of them.

A third embodiment will next be described with reference to FIGS. 2 and 4.

Figure 4A:
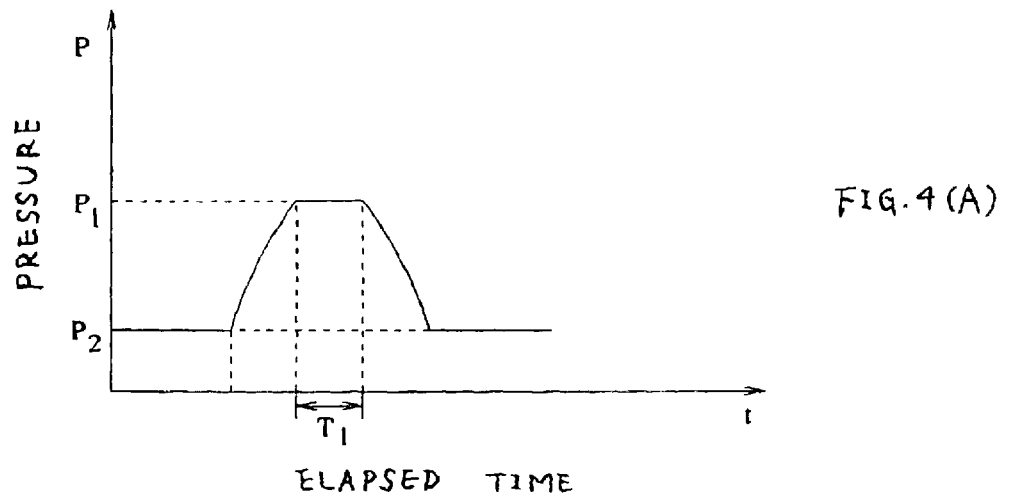
FIGS. 4(A) and 4(B) are respectively views showing depressurized states.
Figure 4B:
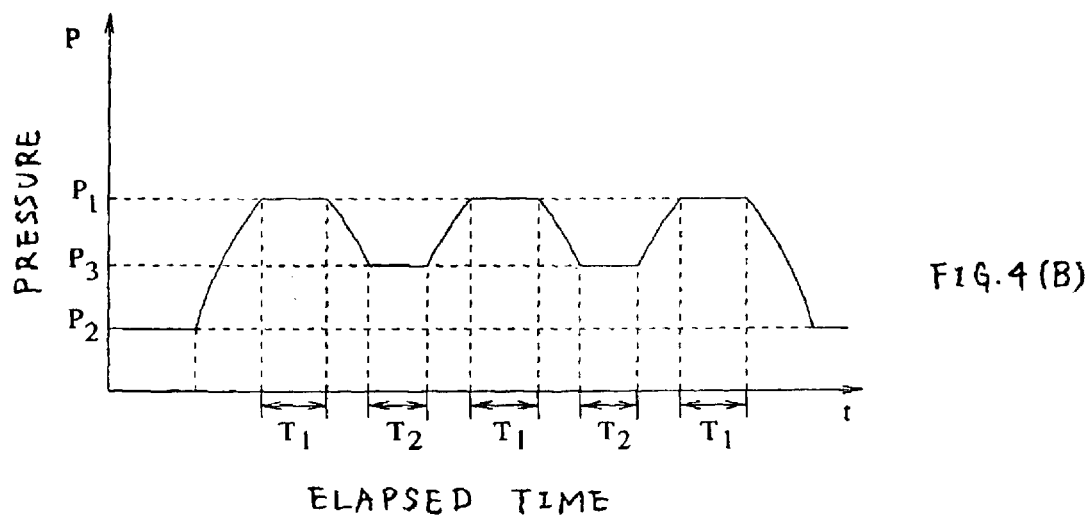

FIG. 4 shows a pressure-reduced state. FIG. 4(A) is a view showing a depressurized state of the third embodiment, and FIG. 4(B) is a view illustrating another depressurized state of the third embodiment, respectively. In FIGS. 4(A) and 4(B), the vertical axis indicates pressure P and the horizontal axis indicates elapsed time t.

The present embodiment is different from the first embodiment in a method of heating the sheet encapsulating material 36 in the first and second steps of the package process. The temperature of the sheet encapsulating material 36 is less than or equal to a curing temperature at which the sheet encapsulating material 36 is cured. The sheet encapsulating material 36 is held low in viscosity and kept for a predetermined time $T_1$ under a reduced pressure of $P_1$ at a temperature at which voids contained in the sheet encapsulating material 36 are easy to be eliminated. Afterwards, the sheet encapsulating material 36 is caused to rise to the curing temperature or higher.

Since other steps, i.e., a relocating step, and third through fifth steps in the package process are just the same as those employed in the first embodiment, the description thereof will therefore be omitted.

In a first step, the bumps-bearing wafer 35 has first been heated to the curing temperature of the sheet encapsulating material 36 or higher in the first embodiment (se FIG. 2(A)), whereas in the present embodiment, the sheet encapsulating material 36 is placed over the bumps-bearing wafer 35 and thereafter heated to a temperature at which voids contained in the sheet encapsulating material 36 low in viscosity are easy to be eliminated, under the reduced pressure of $P_1$ as a second step. The easy-to-eliminate voids temperature may range from 110° C. to 115° C., for example. The depressurized state is done to form or produce the difference between pressure in each void and pressure developed outside the sheet encapsulating material 36 to thereby let the voids escape. Thus, a state close to vacuum is suitably desired as the reduced pressure $P_1$. However, the reduced pressure may be an arbitrary and suitable pressure lower than atmospheric pressure. It may be set so as to range from 600 Pa to 1300 Pa, for example.

Next, the sheet encapsulating material 36 is held for the predetermined time $T_1$ under the reduced pressure $P_1$ while it is being kept at the easy-to-eliminate voids temperature, followed by rise to the curing temperature or higher. Here, for example, ten minutes may be set as the predetermined time $T_1$.

In order to carry out pressure reduction and heating in the first and second steps, an apparatus which utilizes, for example, a vacuum system and a heating apparatus in combination, may be used. Owing to the provision of such steps, the voids are easy to be eliminated as compared with the first and second embodiments.

Three types of methods are considered for the purpose of increasing the temperature of the sheet encapsulating material 36 to the curing temperature or higher to form an encapsulating layer 37. The first one is a method of increasing the temperature of the sheet encapsulating material to a curing temperature, e.g., 150° C. in a pressure-reduced state (increasing the temperature thereof from the easy-to-eliminate voids temperature, e.g., 115° C.) and curing the sheet encapsulating material 36, followed by returning of the sheet encapsulating material 36 to atmospheric pressure. The second one is a method of increasing the temperature of the sheet encapsulating material 36 to the curing temperature, e.g., 150° C. after the sheet encapsulating material 36 has been set to atmospheric pressure (increasing the temperature thereof from the easy-to-eliminate voids temperature, e.g., 115° C.) to thereby curing the sheet encapsulating material 36. The third one is a method of carrying out the sheet encapsulating material from a combined vacuum system and heading apparatus after having been set to atmospheric pressure (the temperature may be lowered due to natural radiation of the bumps-bearing wafer 35), and thereafter increasing the temperature thereof to the curing temperature , e.g., 150° C. again by the heating apparatus to thereby cure the sheet encapsulating material 36. Even if any of these methods is used, the encapsulating resin layer 37 is formed in a state in which the voids have been suitably removed.

A modification of the third embodiment will next be described with reference to FIG. 4(B). In the third embodiment, the sheet encapsulating material 36 is held for the predetermined time at the easy-to-eliminate voids temperature under the reduced pressure $P_1$ and thereafter the temperature of the sheet encapsulating material 36 is increased to the curing temperature or higher. In the present modification, however, the temperature of the sheet encapsulating material 36 is set to a temperature lower than the curing temperature of the sheet encapsulating material 36. Further, the sheet encapsulating material 36 is kept low in viscosity and kept for a predetermined time $T_1$ under a reduced pressure $P_1$ at a void removal temperature at which the voids contained in the sheet encapsulating material 36 are easy to be eliminated. Thereafter, the sheet encapsulating material is held repeatedly plural times for a predetermined time $T_2$ while it is being kept at the void removal temperature under a pressure $P_3$ between a pressure value $P_1$ placed under the reduced pressure and a pressure value $P_2$ of atmospheric pressure, followed by rise to the curing temperature or higher.

The present modification is just the same as the third embodiment in a first step.

In a second step, the sheet encapsulating material 36 is kept for the predetermined time $T_1$, e.g., ten minutes under the reduced pressure $P_1$ while it is being kept at the easy-to-eliminate voids temperature, e.g. a temperature of from 110° C. to 115° C. Thereafter, the sheet encapsulating material 36 is held for a predetermined time $T_2$ e.g., 10 minutes without a rise to the curing temperature, e.g., 150° C. as in the third embodiment while it is being kept at a void removal temperature, e.g., a temperature of 110° C. to 115° C. under a pressure $P_3$ e.g., 2700 Pa between a pressure value $P_1$ placed under the above reduced pressure, e.g., a pressure of 600 Pa to 1300 Pa and a pressure value $P_2$ of atmospheric pressure. Owing to the setting of the pressure $P_3$ between the pressure value P1 placed under the reduced pressure and the pressure value $P_2$ of atmospheric pressure, the voids left on the surface of the sheet encapsulating material 36 can be perfectly expelled outside from the sheet encapsulating material 36. Further, the pressure $P_3$ may be an arbitrary suitable pressure if it is one which produces a difference in pressure between the pressure lying within each void left on the surface of the sheet encapsulating material 36 and external pressure.

Afterwards, the above-described first and second steps are repeated plural times and thereafter the sheet encapsulating material is caused to rise to the curing. temperature or higher. The above-described three methods are considered as a method of increasing the sheet encapsulating material to the curing temperature.

According the modification referred to above, the voids become easier to escape.

The present invention is not limited to the construction of the embodiment. The sheet encapsulating material 36 may be placed over the bumps-bearing wafer 35 in the second step after the pressure reduction and heating have been done in the first step, for example.

As described above, the heating and curing include two types of methods: a method of heating the bumps-bearing wafer 35 by a heating apparatus after the placement of the sheet encapsulating material 36, and a method of heating the bumps-bearing wafer 35 by the heating apparatus before the placement of the sheet encapsulating material 36. In the present embodiment and modification, the heating and curing are done according to the latter method on the grounds of a device configuration using a pressure reducing device. The pressure reduction and heating were done after the placement of the sheet encapsulating material 36 over the bumps-bearing wafer 35 in the first step. However, it may be performed by either of them without being limited to such a method.

Figure 5:
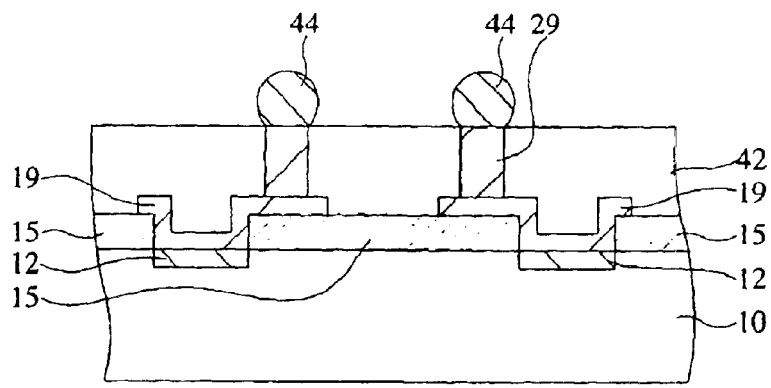
FIG. 5 is a cross-sectional view showing a completed semiconductor device of the first embodiment.

Modifications of the relocating step described in the first embodiment will next be explained with reference to FIGS. 5 through 7.

The relocating step and package process described in the first embodiment are first done. As a result, such a semiconductor device as shown in FIG. 5 is completed. The semiconductor device is formed in such a manner that owing to the provision of the re-wiring pattern 24 in the relocating step shown in FIG. 1, the positions of the bumps 28 and the electrode pads 12, which are viewed from the main surface side of the wafer 10, are rendered different from one another on a plane basis, followed by passing through the package process shown in FIG. 2, whereby the semiconductor device is completed. Thus, one in which the resist 26 has been removed from FIG. 1(D), corresponds to one shown in FIG. 5. An oxidation preventing film 15 shown in FIG. 5 corresponds to the SiN layer 14 and polyimide layer 16 shown in FIG. 1, an adhesion metal layer and a re-wiring pattern 19 shown in FIG. 5 correspond to the adhesion metal layer 18, Cu and re-wiring pattern 24 shown in FIG. 1, and bumps 29 shown in FIG. 5 correspond to the bumps 28 and barrier metal layer 30 shown in FIG. 1, respectively.

Figure 6:
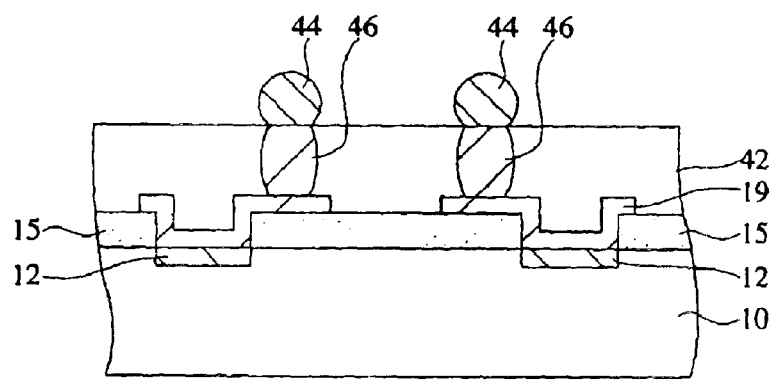
FIG. 6 is a cross-sectional view illustrating a semiconductor device completed according to a modification 1 of a relocating process.

FIG. 6 is a cross-sectional view showing a semiconductor device completed according to a modification 1. According to this configuration, the semiconductor device is equipped with external terminals (bumps) 46 in place of the bumps 29 shown in FIG. 5. If external terminals 44 provided over the external terminals (bumps) 46 are respectively solder, then they may preferably be formed by solder. Since cracks might be produced in the external terminals on the bumps due to a stress developed in an interface between a printed board and the semiconductor device in a wafer level CSP, each bump 29 was increased in height to absorb some of the stress in the configuration shown in FIG. 5. Thus, each of the external terminals (bumps) 46 used as an alternative to the bumps 29 needs a certain degree of height such as about 100 $\mu$m.

Figure 7:
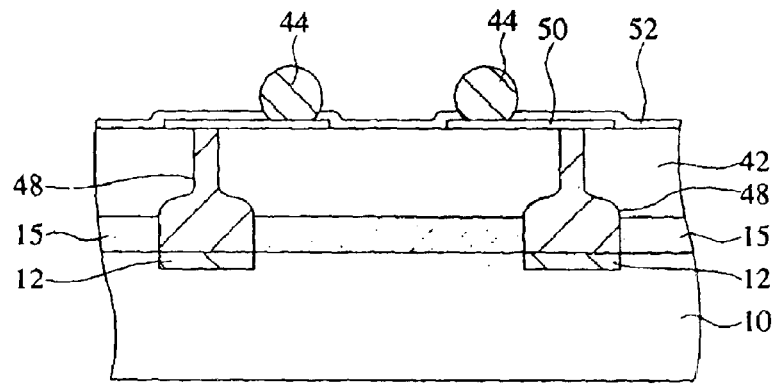
FIG. 7 is a cross-sectional view depicting a semiconductor device completed according to a modification 2 of a relocating process.
Figure 8A:
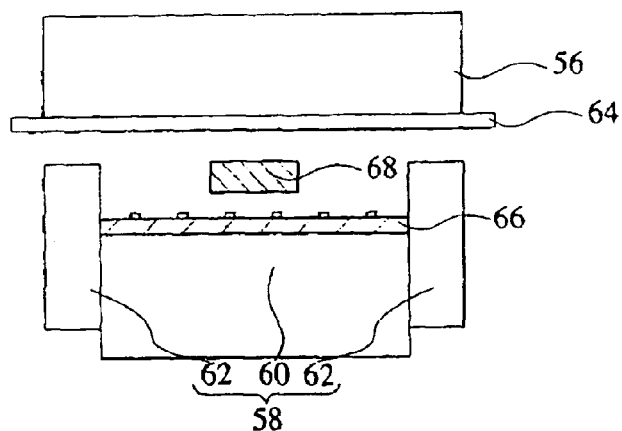
FIGS. 8(A) through 8(F) are respectively cross-sectional views showing a process for manufacturing a conventional semiconductor device.
Figure 8B:
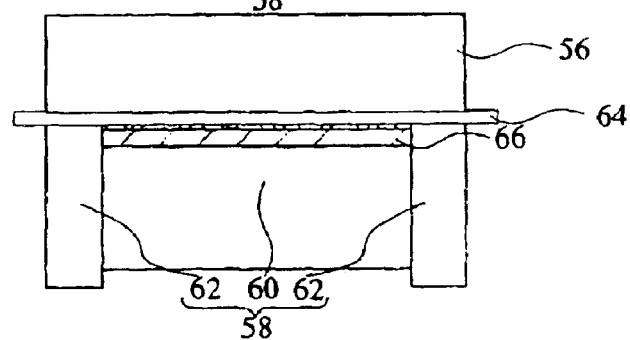
Figure 8C:
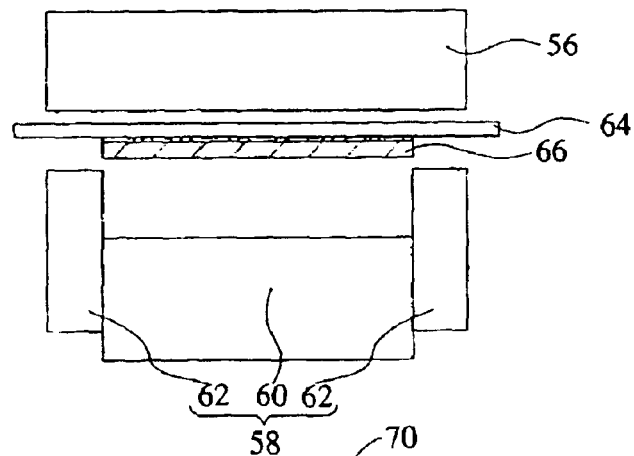
Figure 8D:
Figure 8E:
Figure 8F:

FIG. 7 is a view showing a semiconductor device completed according to a modification 2 of the relocating step. In the present semiconductor device, each re-wiring pattern 50 is formed after the formation of an encapsulating resin layer 42. Owing to its formation, the positions of bumps 48 and electrode external terminals 44 as viewed from the main surface side of a wafer 10 are formed so as to differ from one another on a plane basis. According to such a configuration, the bumps 48 are directly formed over their corresponding electrode pads 12 without the re-wiring patterns being provided thereon. While the bumps 48 are formed as wedge type stud bumps, they may be formed by electrolytic plating in a manner similar to the first embodiment. Thereafter, the encapsulating resin layer 42 is formed according to the aforementioned package process. Next, the external terminals 44 are respectively provided over the re-wiring patterns 50 by solder, for example, after the formation of the re-wiring patterns 50, and a solder resist 52 is formed, whereby the semiconductor device is completed. Even in the case of the configuration formed according to the modification 2, the present semiconductor device brings about an advantageous effect in a manner similar to the semiconductor device according to the first embodiment shown in FIG. 5 in that since the distance between the adjacent external terminals can be arbitrarily varied, the present semiconductor device can be easily connected to a printed wiring board or the like upon electrical connection thereto.

Incidentally, the present invention is not necessarily limited to these embodiments. Various modifications can be made thereto based on the spirit of the present invention and these will not be excluded from the scope of the present invention.

According to the present invention as described above in detail, when a wafer, which has completed a wafer process and has a main surface on which a plurality of bumps respectively electrically connected to a plurality of electrode pads are formed, is brought into a resin encapsulation or molded type package to thereby manufacture a semiconductor device, a method of manufacturing such a semiconductor device includes a step for placing a sheet encapsulating material containing a thermosetting resin over the wafer so as to cover the main surface and a step for heating and curing the sheet encapsulating material by means of a heating apparatus to thereby form an encapsulating resin layer. Therefore, mold and mold-release films are not used as in the conventional wafer level CSP and hence the cost of the semiconductor device can be reduced. Even if the diameter of the wafer increases, the semiconductor device is slight or low in modification cost and high flowability of an encapsulating resin is not required. Therefore, the degree of freedom of the design of the sheet encapsulating material increases. When heating and curing are done in a non-compressed molded state, bumps suffer no damage.

Further, the heating and curing are held for a predetermined time while the sheet encapsulating material is being maintained at an easy-to-eliminate voids temperature. Alternatively, the-heating and curing are held for the predetermined time while it is being kept at the easy-to-eliminate voids temperature. As a result, the amounts of voids developed in the encapsulating resin layer can be reduced.

What is claimed is:

1. A method of manufacturing semiconductor devices, comprising:

forming a plurality of integrated circuits on a main surface of a semiconductor wafer, the plurality of integrated circuits having a plurality of electrode pads for respectively connecting thereto;

forming a plurality of bumps on said main surface that are respectively connected to said electrode pads;

placing a sheet of encapsulating material containing a thermosetting resin having a curing temperature over said semiconductor wafer so as to cover said main surface;

heating and curing said sheet encapsulating material by application of heat to said semiconductor wafer by a heating apparatus on which said semiconductor wafer is placed to thereby form an encapsulating resin layer;

polishing said encapsulating resin layer to expose portions of said plurality of bumps; and dividing said semiconductor wafer into individual semiconductor device chips;

wherein said heating and curing are done in such a manner that the heating of said sheet encapsulating material is at a heating temperature lower than the curing temperature of said sheet encapsulating material, at which the viscosity of said sheet encapsulating material is low and voids contained in said sheet encapsulating material can escape, and said sheet encapsulating material is kept at said heating temperature for a period of time determined to be sufficient for said voids to, be eliminated, and thereafter said sheet encapsulating material is increased in temperature to said curing temperature or higher.

2. The method as claimed in claim 1, further comprising:
forming external terminals each having conductivity so as to be connected to said bumps respectively.

3. A method of manufacturing semiconductor devices, comprising:

forming a plurality of integrated circuits on a main surface of a semiconductor wafer, the plurality of integrated circuits having a plurality of electrode pads for respectively connecting thereto;

forming a plurality of bumps on said main surface that are respectively connected to said electrode pads;

placing a sheet of encapsulating material containing a thermosetting resin having a curing temperature over said semiconductor wafer so as to cover said main surface;

heating and curing said sheet encapsulating material by application of heat to said semiconductor wafer by a heating apparatus on which said semiconductor wafer is placed to thereby form an encapsulating resin layer;

polishing said encapsulating resin layer to expose portions of said plurality of bumps; and dividing said semiconductor wafer into individual semiconductor device chips;

wherein said heating and curing are done in such a manner that the heating of said sheet encapsulating material is at a heating temperature lower than the curing temperature of said sheet encapsulating material, at which the viscosity of said sheet encapsulated material is low and voids contained in said sheet encapsulating material can escape, and said sheet encapsulating material is kept at said heating temperature and at a reduced pressure lower than atmospheric pressure for a period of time determined to be sufficient for said voids to be eliminated, and thereafter said sheet encapsulating material is increased in temperature to said curing temperature or higher.

4. A method of manufacturing semiconductor devices, comprising:

forming a plurality of integrated circuits on a main surface of a semiconductor wafer, the plurality of integrated circuits having a plurality of electrode pads for respectively connecting thereto;

forming a plurality of bumps on said main surface that are respectively connected to said electrode pads;

placing a sheet of encapsulating material containing a thermosetting resin having a curing temperature over said semiconductor wafer so as to cover said main surface;

heating and curing said sheet encapsulating material by application of heat to said semiconductor wafer by a heating apparatus on which said semiconductor wafer is placed to thereby form an encapsulating resin layer;

polishing said encapsulating resin layer to expose portions of said plurality of bumps; and dividing said semiconductor wafer into individual semiconductor device chips;

wherein said heating and curing are done in such a manner that the heating of said sheet encapsulated material is at a heating temperature lower than the curing temperature of said sheet encapsulating material, at which the viscosity of said sheet encapsulating material is low and voids contained in said sheet encapsulating material can escape, and said sheet encapsulated material is kept for a first period of time under a first reduced pressure lower than atmospheric pressures at said heating temperature, and thereafter repeatedly held plural times for a second period of time while being kept at said heating temperature at a second reduced pressure between the first reduced pressure and atmospheric pressure, the sheet encapsulating material being kept at said heating temperature for a total time determined to be sufficient for eliminating said voids, and thereafter said sheet encapsulated material is increased in temperature to the curing temperature or higher.

5. The method as claimed in claim 1, wherein the covering of said sheet encapsulating material is carried out by successively placing said sheet encapsulating material so as to expel air.

6. The method as claimed in claim 1, wherein said bumps are formed in such a manner that the positions thereof as viewed from the main surface side of said wafer and those of said electrode pads are rendered different from one another on a plane basis.

7. The method as claimed in claim 2, wherein said external terminals are formed after the formation of a wiring metal over said sheet encapsulating material in such a manner that the positions of said bumps as viewed from the main surface side of said wafer and those of said external terminals are different from one another on a plane basis.

8. The method as claimed in claim 1, wherein said sheet encapsulating material contains a curing agent for curing said thermosetting resin, in a state in which said curing agent is enclosed in a capsule broken at said curing temperature.

9. The method as claimed in claim 1, wherein said sheet encapsulating material contains an antifoaming agent for removing said voids contained in said sheet encapsulating material.

10. The method as claimed in claim 3, further comprising:
forming external terminals each having conductivity so as to be connected to said bumps respectively.

11. The method as claimed in claim 10, wherein said external terminals are formed after the formation of a wiring metal over said sheet encapsulating material in such a manner that the positions of said bumps as viewed from the main surface side of said wafer and those of said external terminals are different from one another on a plane basis.

12. The method as claimed in claim 3, wherein the covering of said sheet encapsulating material is carried out by successively placing said sheet encapsulating material over said wafer from the end of said sheet encapsulating material so as to expel air.

13. The method as claimed in claim 3, wherein said bumps are formed in such a manner that the positions thereof as viewed from the main surface side of said wafer and those of said electrode pads are rendered different from one another on a plane basis.

14. The method as claimed in claim 3, wherein said sheet encapsulating material contains a curing agent for curing said thermosetting resin, in a state in which said curing agent is enclosed in a capsule broken at said curing temperature.

15. The method as claimed in claim 3, wherein said sheet encapsulating material contains an antifoaming agent for removing said voids contained in said sheet encapsulating material.

16. The method as claimed in claim 4, further comprising:
forming external terminals each having conductivity so as to be connected to said bumps respectively.

17. The method as claimed in claim 16, wherein said external terminals are formed after the formation of a wiring metal over said sheet encapsulating material in such a manner that the positions of said bumps as viewed from the main surface side of said wafer and those of said external terminals are different from one another on a plane basis.

18. The method as claimed in claim 4, wherein said bumps are formed in such a manner that the positions thereof as viewed from the main surface side of said wafer and those of said electrode pads are rendered different from one another on a plane basis.

19. The method as claimed in claim 4, wherein said sheet encapsulating material contains a curing agent for curing said thermosetting resin, in a state in which said curing agent is enclosed in a capsule broken at said curing temperature.

20. The method as claimed in claim 4, wherein said sheet encapsulating material contains an antifoaming agent for removing said voids contained in said sheet encapsulating material.

21. The method as claimed in claim 1, further comprising:
preheating said semiconductor wafer by said heating apparatus prior to placing said sheet of encapsulating material over said semiconductor wafer.

22. The method as claimed in claim 3, further comprising:
preheating said semiconductor wafer by said heating apparatus prior to placing said sheet of encapsulating material over said semiconductor wafer.

23. The method as claimed in claim 4, further comprising:
preheating said semiconductor wafer by said heating apparatus prior to placing said sheet of encapsulating material over said semiconductor wafer.

* * * * *